(12) United States Patent
Boucherat et al.

(10) Patent No.: US 8,190,401 B2
(45) Date of Patent: May 29, 2012

(54) CREATING ROAD MODELS

(75) Inventors: Arnaud Boucherat, Westminster, CO (US); Matthew Lynn Jones, Thornton, CO (US)

(73) Assignee: Trimble Navigation Limited, Sunnyvale, CA (US)

( * ) Notice: Subject to any disclaimer, the term of this patent is extended or adjusted under 35 U.S.C. 154(b) by 1059 days.

(21) Appl. No.: 11/810,184

(22) Filed: Jun. 4, 2007

(65) Prior Publication Data

US 2008/0298891 A1    Dec. 4, 2008

(51) Int. Cl.
*G06F 17/50*    (2006.01)

(52) U.S. Cl. ............ 703/1; 345/427; 701/454; 701/442; 701/445; 701/438; 404/1; 404/64; 404/74; 404/19; 382/104

(58) Field of Classification Search ............ 701/102, 701/200, 208, 207, 454, 442, 445, 436; 345/419, 345/619, 427; 702/5; 703/1; 404/1, 64, 404/74, 19; 382/104
See application file for complete search history.

(56) References Cited

U.S. PATENT DOCUMENTS

| | | | |
|---|---|---|---|
| 6,470,265 B1 * | 10/2002 | Tanaka | 701/208 |
| 7,516,041 B2 * | 4/2009 | Smartt et al. | 702/167 |
| 2006/0217879 A1 * | 9/2006 | Ikeuchi et al. | 701/208 |
| 2007/0014488 A1 * | 1/2007 | Chen et al. | 382/294 |
| 2007/0080961 A1 * | 4/2007 | Inzinga et al. | 345/419 |
| 2007/0129892 A1 * | 6/2007 | Smartt et al. | 702/5 |
| 2007/0226243 A1 * | 9/2007 | Fuki et al. | 707/102 |

\* cited by examiner

*Primary Examiner* — Kamini S Shah
*Assistant Examiner* — Cuong Luu

(57) ABSTRACT

Embodiments of the present invention recite a computer implemented method and system for creating a road model. In one embodiment, an identification of an intersection of a first road and a second road is received. At least one designated elevation is received at which the first road and the second road should merge. Finally a united layer is automatically created for the intersection wherein a first plurality of strings defining the first road and a second plurality of strings defining the second road intersect at the at least one designated elevation.

24 Claims, 14 Drawing Sheets

1100

```
START
  ↓
┌─────────────────────────────────────────────────────────┐
│ IDENTIFYING A FIRST ROADWAY OF A DIVIDED ROAD USING A FIRST │
│                   PLURALITY OF STRINGS                   │
│                          1110                            │
└─────────────────────────────────────────────────────────┘
  ↓
┌─────────────────────────────────────────────────────────┐
│    ASSIGNING A SUPERELEVATION REGION TO THE FIRST ROADWAY │
│                          1120                            │
└─────────────────────────────────────────────────────────┘
  ↓
┌─────────────────────────────────────────────────────────┐
│ IMPLEMENTING AN AXIS OF ROTATION WITHIN THE SUPERELEVATION │
│              REGION OF THE FIRST ROADWAY                 │
│                          1130                            │
└─────────────────────────────────────────────────────────┘
  ↓
 END
```

FIG. 11

CREATING ROAD MODELS

TECHNICAL FIELD

Embodiments in accordance with the present invention generally pertain to design software for creating models of roads.

BACKGROUND

In the construction of roads and related projects, the amount of documentation and data which are factors in creating a model of the project is considerable. In addition, there exists a huge variety of data sets including paper plans and printed specification books that define how a road is to be constructed, Computer Aided Design (CAD) files of these same drawings, as well as a wide variety of software and data storage formats used in the design of the roads.

The process of transferring designs into road models and road models into formats that are readily usable by field devices is cumbersome in the current art. When a single road model is interpreted by different field devices it will lead to different interpretations and results. Early road modeling software lacked the ability to explicitly describe a road and all its components like the intersections. Interpretation of road models generated by these early road modeling packages could vary considerably but be technically acceptable based upon the information provided in the model. The most common methodology uses alignments and templates of cross sections along the alignments to describe a road. Road modeling software that attempts to apply one template from those alignments will have trouble modeling a divided highway with multiple roadways and ramps joining and leaving the roadways. When a single element changes, the entire template typically has to be redefined. This typically results in numerous revisions to the model being sent to the field. Also, if a road model is constrained by the limitations of a given file format, the result can be so complex that it is difficult to verify whether the road is correct, to find errors in the road, or to even understand the model. This is particularly difficult in the field where interaction with the designers may be difficult.

Additionally, the numerous file formats define elements of the road model in different manners. For example, the way one template transitions to another template is different in various road model field formats. This means that elements of the original road model will convert differently to each of the field file formats. Thus, different field devices may interpret the same road model differently even though they are reading from the same file, potentially leading to different models of the same road.

FIG. 1 shows an exemplary representation of a conventional road model. In FIG. 1, a roadway 101 is shown with a center line 105. Spaced along center line 105 is a series of cross sections (e.g., 106a, 106b, 106c, 106d, 106e, 106f). The cross sections show the profile of the road section at that particular portion of roadway 101. Cross section 106c is shown in greater detail in FIG. 1. The elevations associated with a particular cross section may be defined as an actual elevation of portions 110, 111, and 112 of cross section 106c, or by any relative reference from another defined elevation. Contractors rely on the field software to interpolate elevations of the road model between cross-sections to create a continuous road surface. Thus, two devices, reading the same model in the field, could calculate different elevations for the same point.

One problem associated with using cross section road models is that they are not well suited for representing the road surface at an intersection. FIG. 2 shows an exemplary representation of a conventional road model of an intersection. In FIG. 2, roadway 101 is intersected by roadways 201 and 202. Roadways 201 and 202 each have a corresponding center line 205 and 210 associated therewith. Also shown is a center line 215 of a turn lane from roadway 101 to roadway 202. For clarity the spacing of the cross sections shown in FIG. 2 is greater than would typically be used with an intersection as represented in FIG. 2. This is because, in actual road models, curves and other complex shapes require closer spacing of the cross sections compared with straight sections of roadway in order to accurately represent the shape of the roadway. In FIG. 2 the plurality of cross sections where roadways meet creates an excessive number of cross sections in the road model. This makes it difficult for the creator of the road model to verify with absolute certainty that the road model is indeed correct. This also leads to the field device incorrectly interpreting the road model.

FIG. 3 shows an exemplary representation of another conventional road model. In FIG. 3 a roadway 301 is defined by strings 302 and 303 and a center line string 304. In the field, a contractor may lay out an actual string at the location and elevation of points of the road model string. It is appreciated that a particular road model may typically use a different number of strings than shown in FIG. 3. Strings 302, 303, and 304 are geometries which run parallel with roadway 301 and describe the geometry of roadway 301. A given point along a string (e.g., string 302) can be described with a 2-dimensional location and an associated elevation (e.g., station/offset/cross slope). Again, the elevation may be described using the actual elevation at that point, or as an offset from another elevation.

Strings are advantageous over cross section road models in that at road intersections, there are fewer intersecting data points which makes it easier to interpret and verify by the contractor. In a road model using strings, each layer of the roadway is defined by a separate set of strings. Thus, the top surface of a road is defined by one set of strings, and the top surface of any sublayer is separately defined by respective sets of strings. As a result, at an intersection, the road model comprises numerous layers of strings which cross each other. It is unusual for layers of different roads to match even though the implication in the design is that common layers should match. This would result in gaps, bumps, or drainage problems at the intersection if the intersection were built following the model.

In the past, slight differences in the elevation of road layers would be smoothed by the operator of the road construction equipment. However, machine control systems are increasingly being used in the road construction industry. The machine control systems access a data file and can control the location, angle, and elevation of an implement (e.g., a blade of a bulldozer or grader) to precisely match the road model. In straight sections of roads, machine control systems are well suited for constructing the road according to the model. However, machine control systems do not allow an operator to "eyeball" a smooth transition between the roadway surfaces at an intersection.

Additionally, cross-section and string based road modeling systems have difficulties in matching the layers in a manner which is convenient to the user.

SUMMARY

Embodiments of the present invention recite a computer implemented method and system for creating a road model. In one embodiment, an identification of an intersection of a first road and a second road is received. At least one designated elevation is received at which the first road and the second road should merge. Finally a united layer is automatically created for the intersection wherein a first plurality of strings defining the first road and a second plurality of strings defining the second road intersect at the at least one designated elevation.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 11 is a flowchart of an exemplary method for creating a road model in accordance with embodiments of the present invention.

DETAILED DESCRIPTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions, which follow, are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art.

A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving," "creating," "defining," "changing," "identifying," "selecting," "determining," "utilizing," "inserting," "extending," "using," "assigning," "implementing," "merging," or the like, refer to the actions and processes of a computer system, or a similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
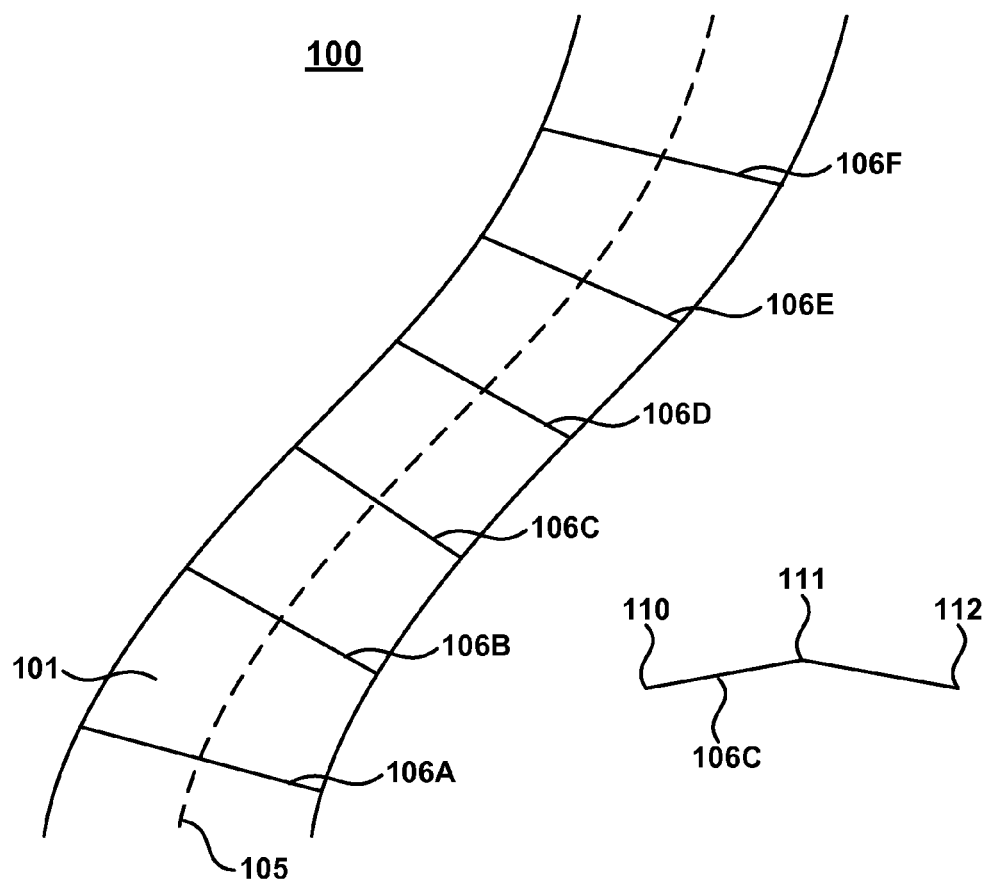
FIG. 1 shows an exemplary representation of a conventional road model.
Figure 2:
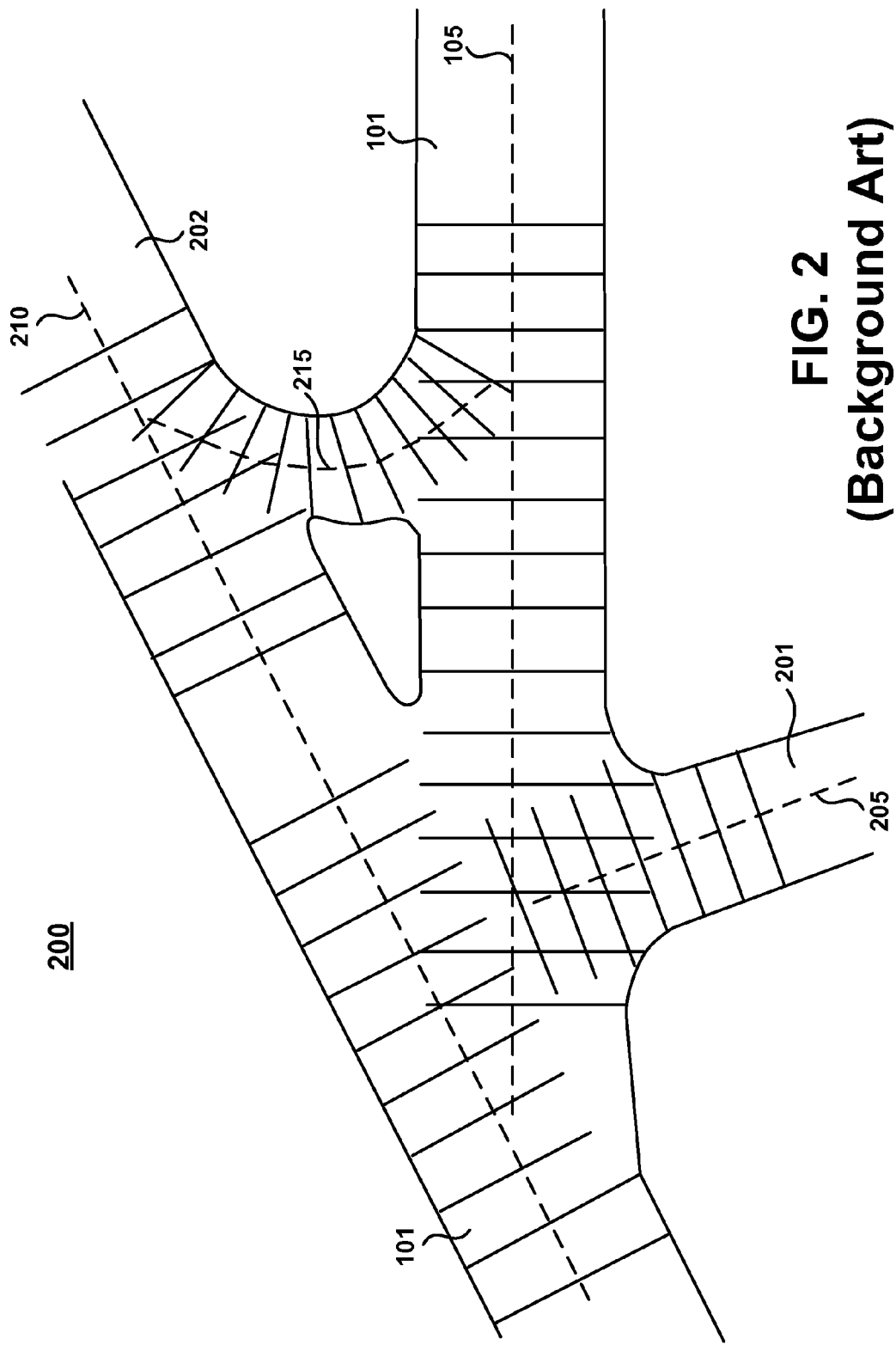
FIG. 2 shows an exemplary representation of a conventional road model of an intersection.
Figure 3:
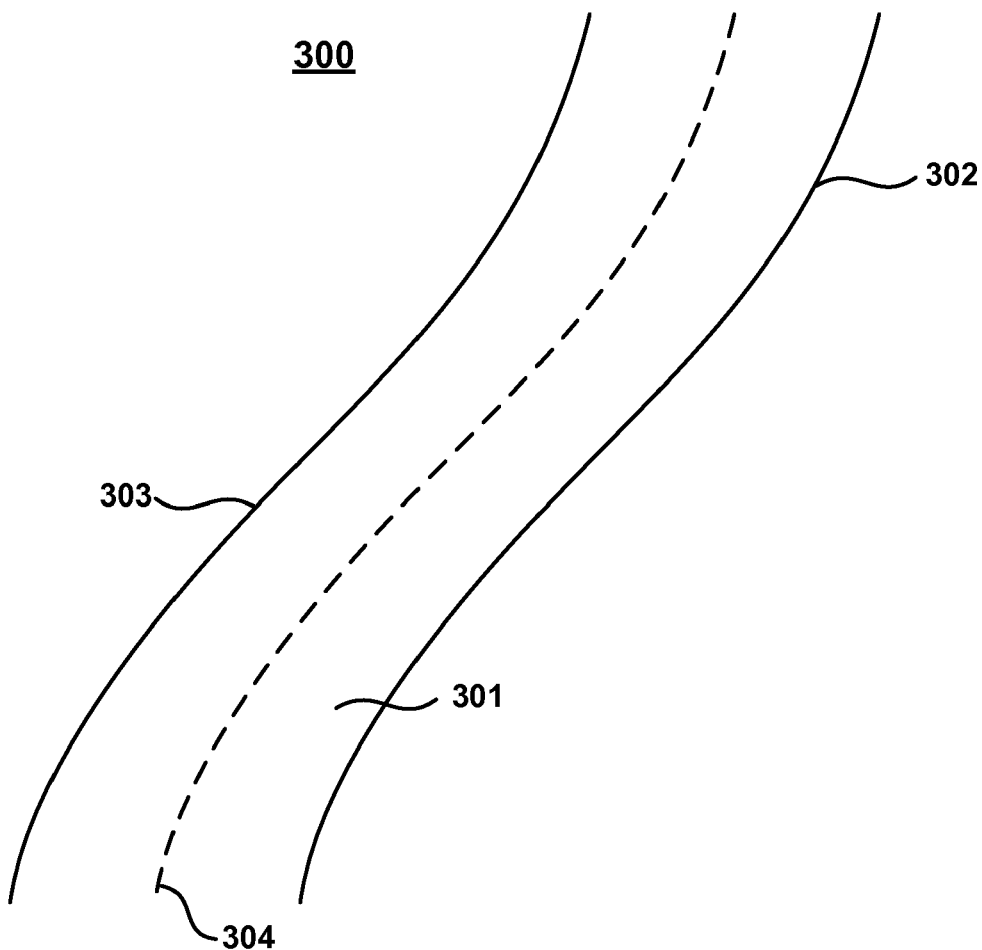
FIG. 3 shows an exemplary representation of a conventional road model.
Figure 4:
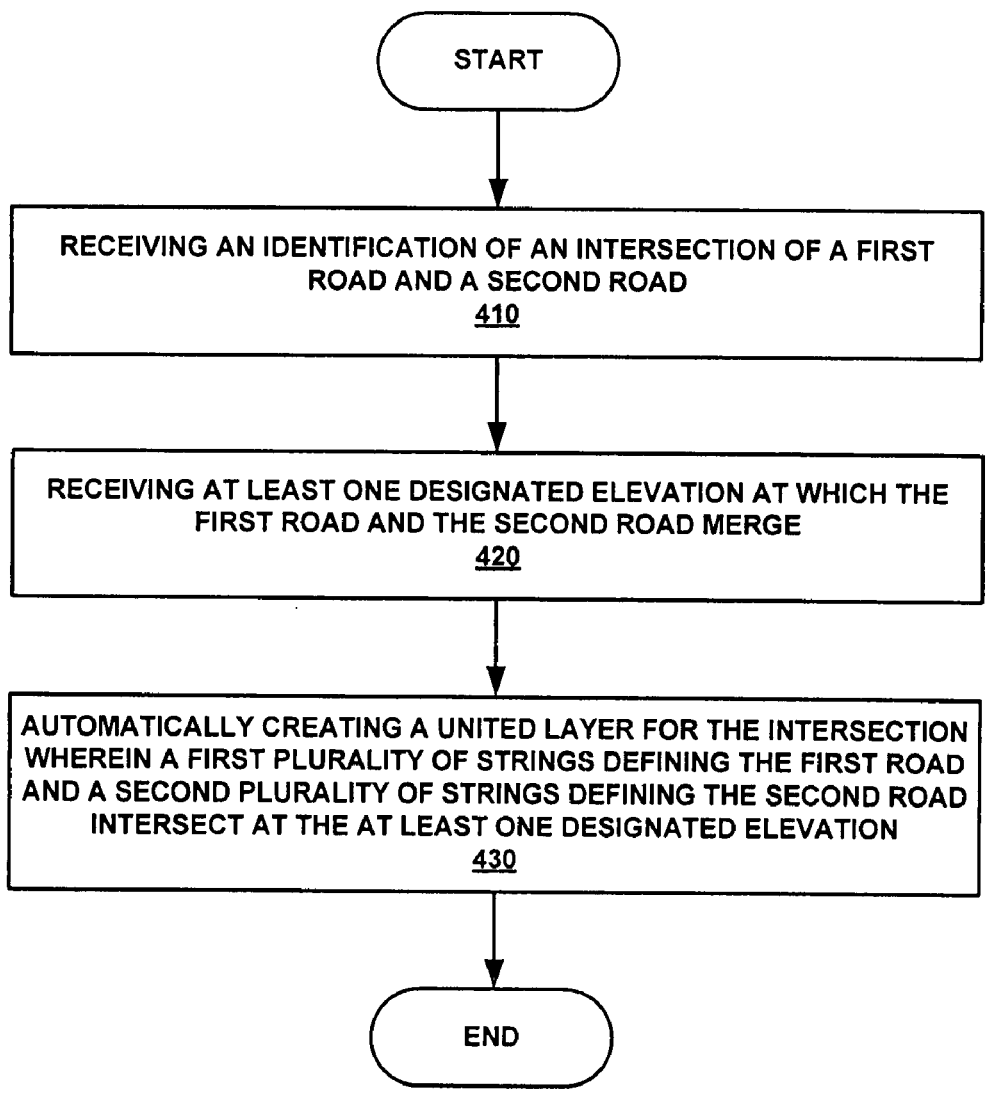
FIG. 4 is a flowchart of a method for creating intersections of road models in accordance with embodiments of the present invention.
Figure 5A:
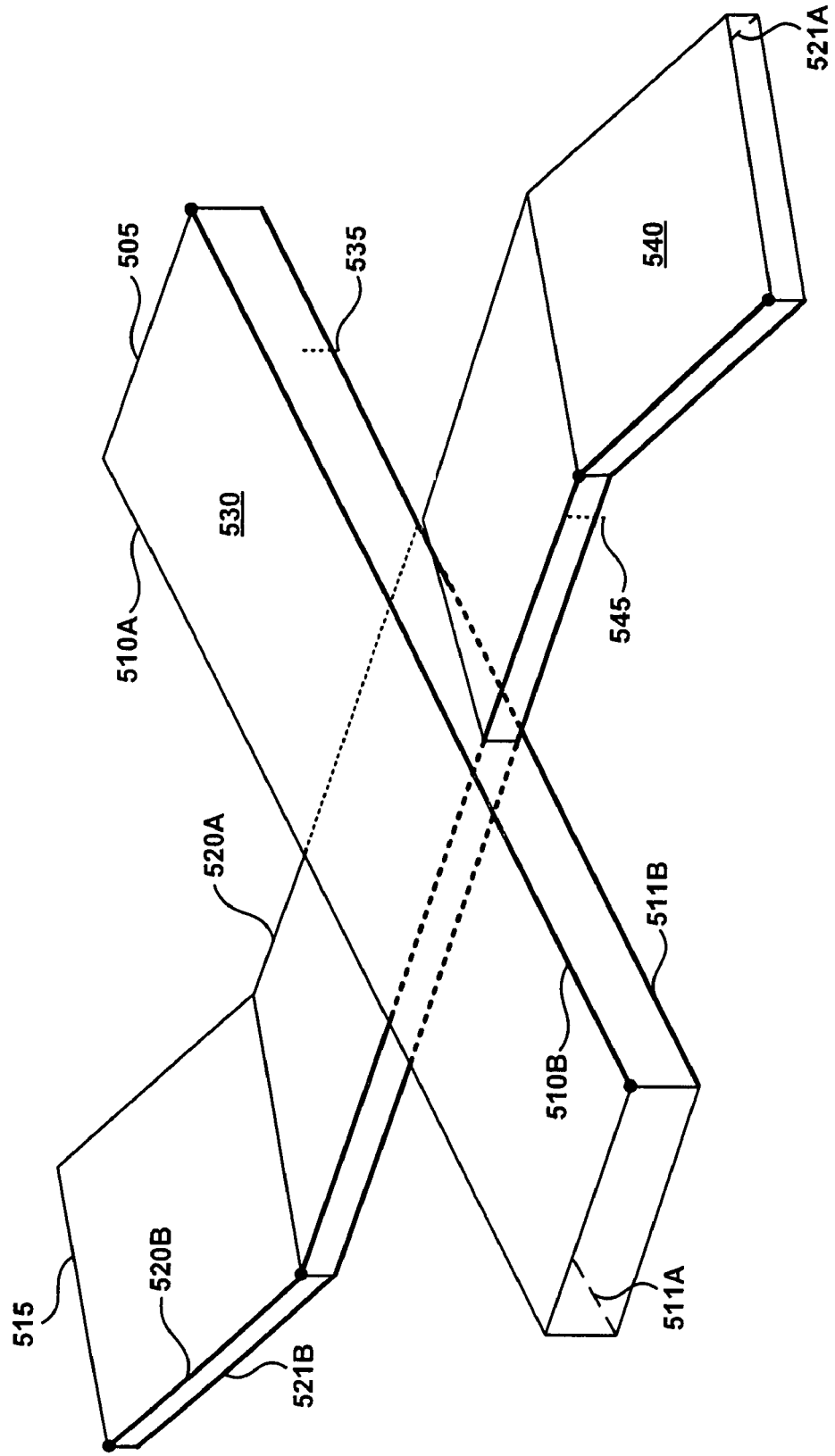
FIG. 5A is a perspective view of a road model intersection prior to creating a united layer for the intersection.

FIG. 4 is a flowchart of a method 400 for creating road models in a accordance with embodiments of the present invention. In step 410 of FIG. 4, an identification of an intersection of a first road and a second road is received. With reference now to FIG. 5A, which shows a perspective view of a road model intersection prior to creating the intersection, a first road 505 has a top edge defined by strings 510a and 510b. A top edge of a second layer (e.g., a sub-layer, subgrade, etc.) of road 505 is defined by strings 511a and 511b. As an example, the top surface of road 505 may represent the paved surface (e.g., with asphalt) which is actually traveled upon. The second layer may represent crushed stone, aggregate, or fill which is used to stabilize the top layer of the road. Similarly, a top edge of a second road 515 is defined by strings 520a and 520b while the top edge of a second layer of road 515 is defined by strings 521a and 521b. It is noted that roads 505 and 515 may comprise more or fewer layers which are defined by strings in embodiments of the present invention. In embodiments of the present invention, each layer (e.g., a top layer and any sublayers) of a road in the model holds the definitions of the strings as defined by the user. This is where the user goes to retrieve and edit the strings As shown in FIG. 5A, no intersection of roads 505 and 515 is defined here. Both roads exist independently one from the other. From the top, the strings appear to intersect correctly. However, the difference in elevations results in an incorrect model for the intersection. Each road has two layers, and each single layer is attached to a united layer. Thus, a top united layer 530 for road 505 is the surface defined between strings 510a and 510b while a second united layer 535 is defined between strings 511a and 511b. Similarly, a top united layer 540 of road 515 is defined by strings 520a and 521a while a second united layer 545 is defined by strings 520b and 521b. Thus, there are a total of four united layers in this case and four different surfaces to be built. At this point, both roads are considered independent entities. Therefore, the united layers overlap where the roads intersect.

In step 420 of FIG. 4, at least one designated elevation at which the first road and the second road merge is received.

Figure 5B:
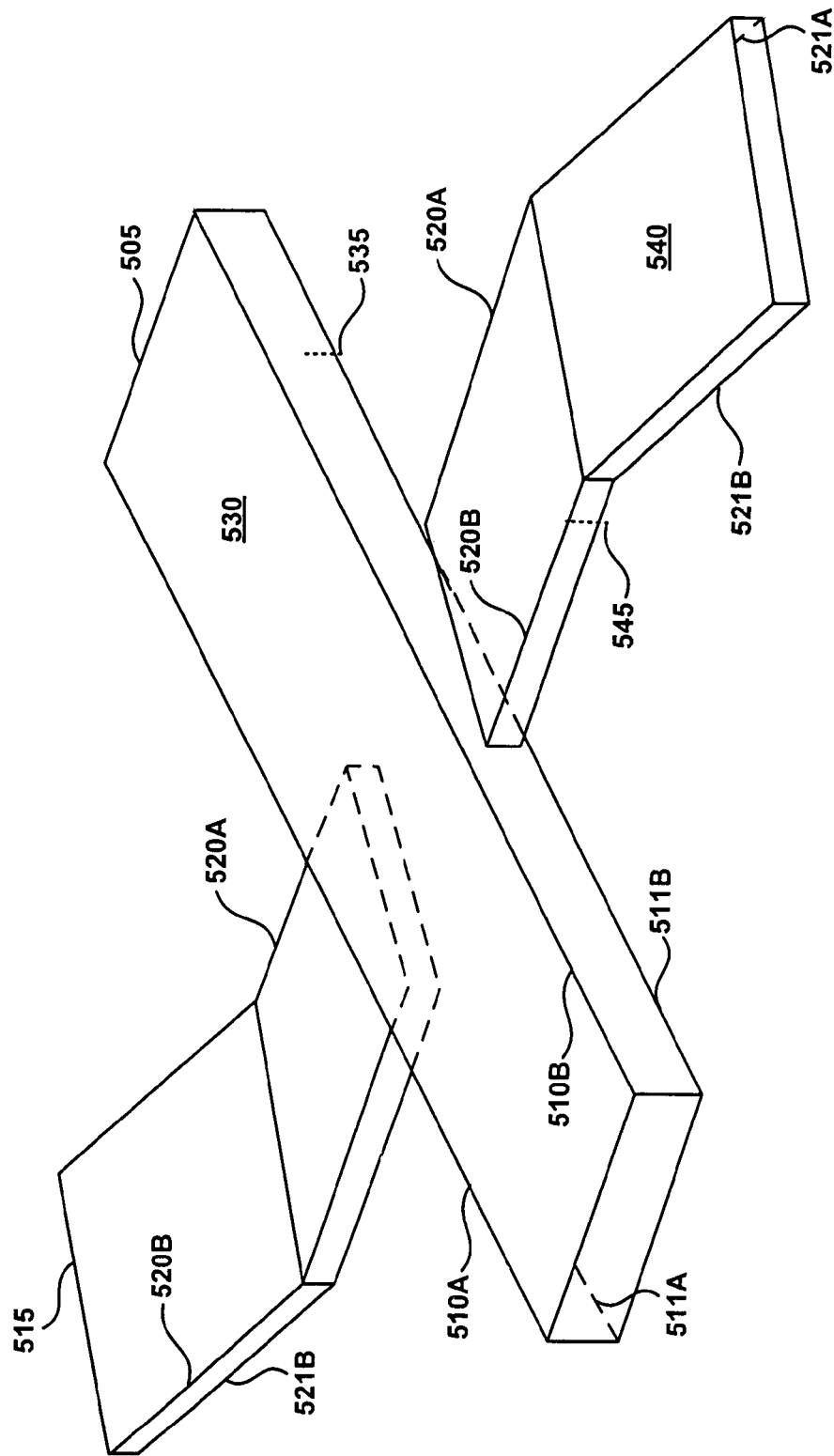
FIG. 5B is a perspective view of a road model intersection after creating the intersection in accordance with embodiments of the present invention.

Referring now to FIG. 5B, if the intersection were constructed as shown, there would be an abrupt change in elevation of the road surface where road 515 enters the intersection. Additionally, where the layers of road 515 enter the intersection, there would be different materials at points of the layers due to the misalignment of the elevations. In embodiments of the present invention, an indication is received that the roads actually intersect. In other words, the designer of the road model is stating that the top layer of road 505 and the top layer of road 515 should be a continuous surface. In one embodiment of the present invention, one of the roads comprising the intersection is identified as being at the correct elevation for the intersection. As an example, if road 505 comprises a major roadway and road 515 comprises a secondary road, road 505 might be selected as primary road and therefore as being at the correct elevation for the intersection. Thus, united layer 530 should be built as a smooth continuous surface as much as possible.

It is appreciated that the choice of the elevation may be based upon other criteria in embodiments of the present invention. Additionally, the identification of the correct elevation for the intersection is not limited to identifying a particular road which is at the correct elevation. For example, in another embodiment of the present invention, a user may define the elevation at which road 505 and road 515 intersect. This may be, for example, an average between the currently modeled elevations of the roads where they intersect or a user-defined elevation. It is noted that in embodiments of the present invention, a common united layer may not be created for sublayers of intersecting roads. Thus the sublayer of one road may be interrupted at the intersection rather than merging it with the sublayer of another road at an intersection and continue on the other side of the intersection.

In one embodiment of the present invention, the consequence of identifying one road as being at the correct elevation for the intersection is that the layers of road 515 are not going to be used within the intersection to avoid any dual definition of elevations within the intersection. Thus, while four united layers still exist, no overlap is allowed between roads 505 and 515 because both roads now belong to the same system. In one embodiment of the present invention, a model intersection object is logically created. As shown in FIG. 5B, no conflict exists regarding the elevations of united layers 530 and 540 and/or united layers 535 and 545.

Upon identifying road 505 as being at the correct elevation for the intersection, embodiments of the present invention designate each of the strings defining united layer 530 of road 505 as being at the correct elevation. Thus as shown in FIG. 5B, strings 510a and 510b are identified by the present invention as being at the correct elevation for the top surface of the intersection (e.g., united layer 530). Similarly, strings 511a and 511b may be identified by the present invention as being at the correct elevation for the top of a sublayer (e.g., united layer 535) which is directly below.

In step 430 of FIG. 4, a united layer (e.g., 550 of FIG. 5C) is automatically created for the intersection wherein a first plurality of strings defining the first road and a second plurality of strings defining the second road intersect at the at least one designated elevation. In embodiments of the present invention, a united layer 550 is created which is defined by the elevations of the top layer strings (e.g., 510a, 510B, 520a, and 520b) of the roads as they meet at the intersection and resolves intersections between linear geometries within this layer. In embodiments of the present invention, a respective united layer may additionally be created for each intersecting sublayer which is defined by the strings of each roadway entering a particular intersection.

Referring again to FIG. 5C, road 505 and road 515 share the same top surface. The layers as defined originally for both roads are still the ones defined by the user, but the roads now share the same united layer 550 for the top surface. There are now a total of three united layers (e.g., 550, 535, and 545) instead of four. The strings as originally defined in layer 530 and layer 540 now intersect in the same system (e.g., united layer 550).

Figure 5C:
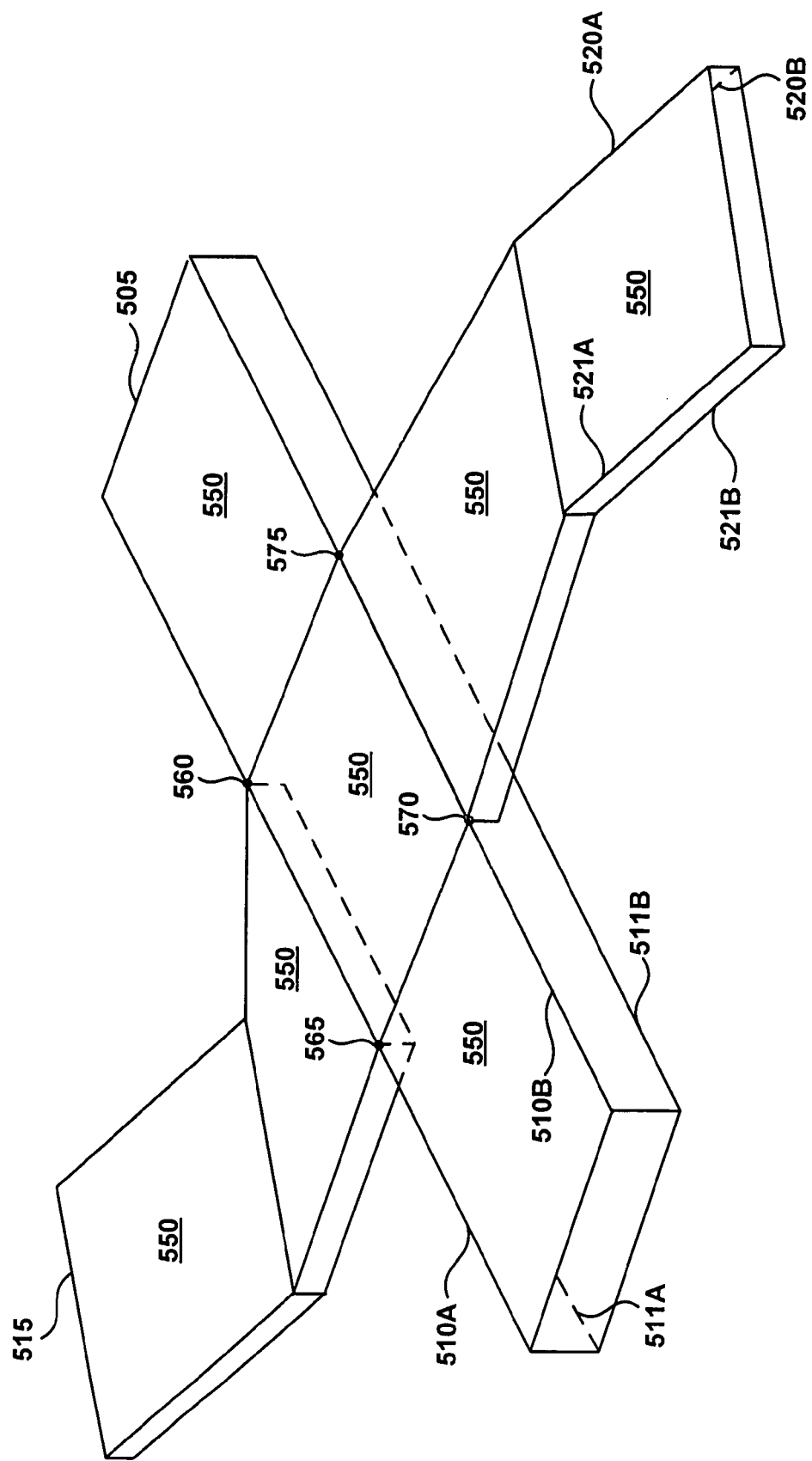
FIG. 5C is a perspective view of a road model intersection after creating a united layer for the intersection in accordance with embodiments of the present invention.

Embodiments of the present invention compute positions where linear geometries intersect and provide the same elevation by designating an intersection specific point. Each intersection specific point is thus associated with specific linear geometries and are further associated with a specific elevation which is added to the vertical profiles of the strings associated with that intersection specific point. As shown in FIG. 5C, four "Intersection Vertical Points" 560, 565, 570, and 575 are computed on these local intersections. In one embodiment of the present invention, the definition of united layer 550 also comprises the definition of these Intersection Vertical Points. The actual positions of points 560, 565, 570, and 575 depend on the location at which the strings intersect. Additionally, their elevations can be modified by the user to be able to build a smooth intersection with good water drainage.

In one embodiment, the default Intersection Vertical Points match the elevations of strings 510a and 510b where they intersect with strings 520a and 520b since road 505 has been identified as the primary road. In embodiments of the present invention, since united layer 550 is based on the strings contained in layer 530 and layer 540, the Intersection Vertical Points must also impact the strings as well to be effective. Thus, in one embodiment, a "Calculated Vertical Point" representing each Intersection Vertical Point of the united layer 550 is inserted into each corresponding string. In so doing, string 510a is now defined by its original points plus two Calculated Vertical Points 560 and 565, creating then a calculated profile. Similarly, string 510b is now defined by its original points plus two Calculated Vertical Points 570 and 575, creating then another calculated profile. In one embodiment, string definitions for sublayers remain unchanged because they do not belong to the system defined by united layer 550. The user can edit the strings at any time in the process in embodiments of the present invention. While accessing the strings definition, the user will see the original points and the automatically added Calculated Vertical Points.

In other words, embodiments of the present invention determine the two-dimensional location (e.g., station and lateral offset) where a pair of strings intersects, and assign a single elevation for that point. As an example, embodiments of the present invention determine the two-dimensional position at which string 520a intersects string 510a (e.g., point 560) and assigns a single elevation to point 560. It is noted that united layer 550 is not required to be level in embodiments of the present invention. Thus, the elevation of a string may vary from one side of the intersection. As a result, the elevations of Intersection Vertical Points 560, 565, 570, and 575 may differ at a given intersection.

In one embodiment of the present invention, the elevation of one string may be defined as a vertical offset from the elevation of another string. For example, string 511b may be defined as having an elevation 6 inches below string 510b. If a user of the present invention makes a change in the road model such that the elevation of string 510b is changed, embodiments of the present invention will automatically change the elevation of string 511b as well to maintain the vertical offset. Thus, one embodiment of the present invention resolves differences in elevation of all intersecting strings which constitute united layer 550. In another embodiment, the elevations of strings are defined separately such that a change in the elevation of one string will not change the elevation of another string disposed above or below it.

In so doing, embodiments of the present invention automatically resolve some imperfect design issues where the road model is not fully descriptive, which could result in unsmoothed intersections if not corrected. Furthermore, this is done in a manner which is largely automated from the perspective of the designer of the road model. Because strings are a series of points having an assigned elevation, a calculated profile is created which describes the elevation of a road along the strings. In embodiments of the present invention, a specific point (e.g., 560 of FIG. 5C) is added to the calculated profile of each string which has a specific elevation. This point is shared by the plurality of strings which intersect that point. In the example of FIG. 5C, point 560 is added to the calculated profile of strings 510a and 520a. Similarly points 565, 570, and 575 are added to the calculated profiles of the other strings which intersect at united layer 550.

Embodiments of the present invention facilitate creating road models which are usable by machine control systems of road construction equipment. As discussed above, the increasing use of machine control systems to control the location of earthmoving equipment, and their attached implements, makes human intervention to correct a difference in elevation at the intersection is more difficult to accomplish. This is because the machine control systems rely upon complex mathematical models to control the location and orientation of an implement coupled with the earthmoving equipment. Thus, if the road model is incorrect, the machine control system is not configured to correct the error. Additionally, embodiments of the present invention create road models which are readily comprehensible, both to the designer and to the contractor in the field. As a result, embodiments of the present invention facilitate verifying whether a model is correct and whether it is being correctly implemented in the field, or if errors are being made in creating the road.

Furthermore, embodiments of the present invention facilitate easily modifying a road model. For example, if a designer decides to alter the calculated profile of the strings defining road 505 (e.g., to create a smoother ride for commuters, or to resolve a drainage problem), an embodiment of the present invention automatically alters the elevations of all of the strings of the united layers such that they share the same elevation where they intersect. For example, if a designer decides to lower the level of road 505, by lowering the elevation of strings 510a, 510b, 511a, and 511b the result will be that the elevation of united layer 550 will also be lowered by a similar amount to reflect the change in elevation. Thus, embodiments of the present invention will automatically lower the elevations of strings 520a, 520b, 521a, and 521b in order to reflect the changed elevation made to road 505. As discussed above, in another embodiment, the elevations of strings may be defined such that a change in the elevation of a given string has no effect on the elevation of another string in the road model.

Figure 6:
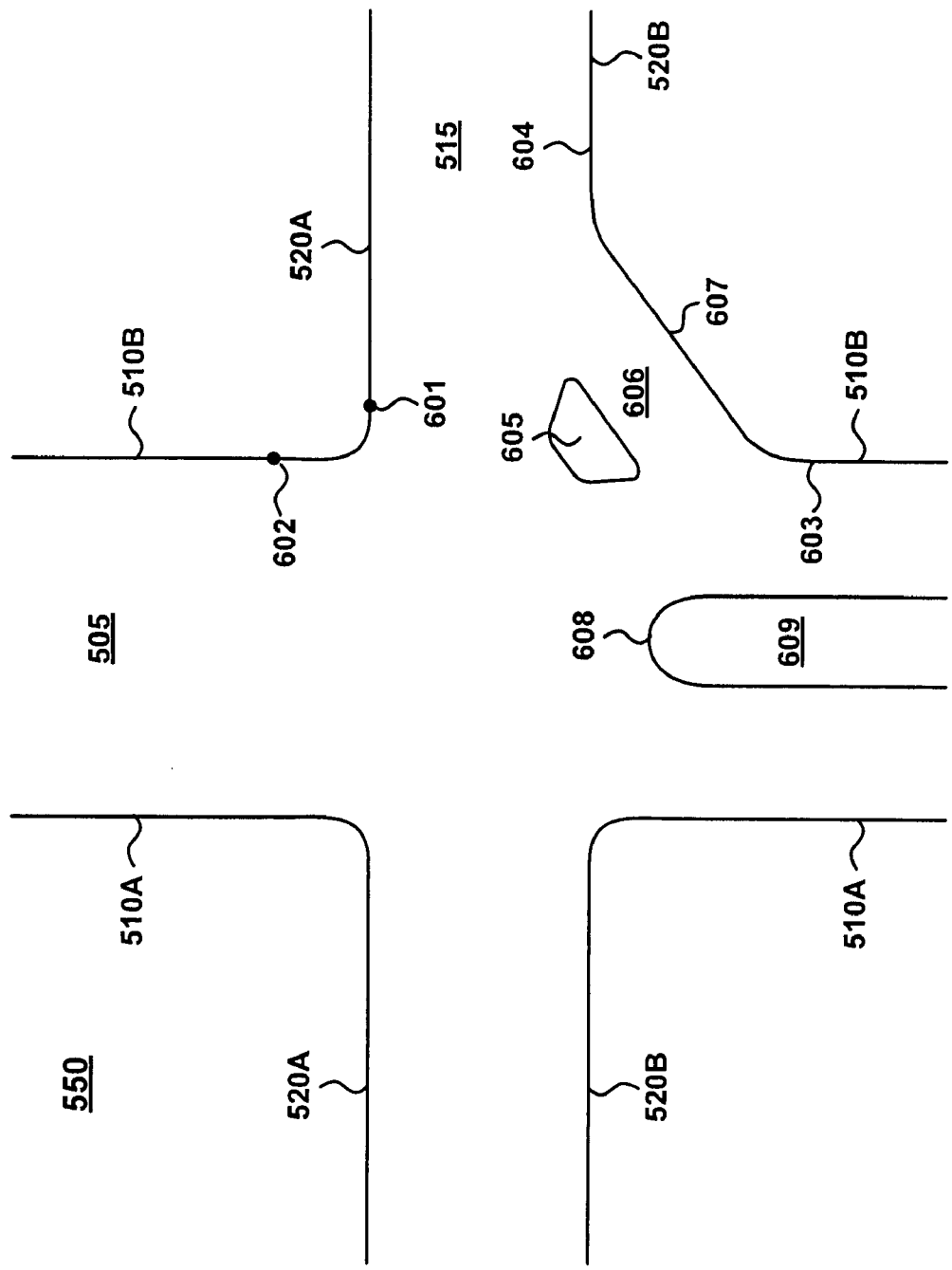
FIG. 6 is an overhead view of a road model intersection in accordance with embodiments of the present invention.

FIG. 6 is an overhead view of a road model united layer 550 in accordance with embodiments of the present invention. In the embodiment of FIG. 6, a road 505 intersects road 515 at the intersection shown. In embodiments of the present invention, a designer can utilize string connectors to create features typically found at traffic intersections. Embodiments of the present invention can utilize redefined string connectors including, but not limited to Arc, Segment, Two-Arcs, Three-Arcs, Arc-Tangent-Arc, and Taper-Arc-Taper. For example, a typical corner at an intersection is rounded rather than presenting a sharp 90° corner. Referring to FIG. 6, the corner where string 510b intersects string 520a has a radius defined by a string connector between points 601 and 602. In one embodiment of the present invention, string 520a is logically terminated at point 601 and string 510b is logically terminated at point 602. In another embodiment, string 520a and 510b may be continued through the intersection to, for example, control slopes and drainage. A user can then access a plurality of string connectors and insert the desired shape to connect the ends of the two strings. In embodiments of the present invention, the string connectors are not considered part of either of the intersecting roads (e.g., 505 and 515), but are rather considered part of the respective united layer using the string connectors.

Similarly, a designer can create a turn lane (e.g., right turn lane 606 by inserting the appropriate string connectors into the road model. For example, in FIG. 6 the designer has inserted a string connector 607 which connects points 603 and 604. Again, in the present example, string 520b has been logically terminated at point 604 and string 510b has been logically terminated at point 603. It is again noted that in embodiments of the present invention, strings may be continued through an intersection as well. Also, in creating right turn lane 606, the designer has created an island 605.

In one embodiment, the designer can create island 605 by designating strings which comprise the straight sections of island 605 and connecting them with additional string connectors. In FIG. 6, a median 609 has been created in a manner similar to that described above with reference to island 605. That is, in one embodiment, the designer of the road model can create strings which define the straight edges of median 609 and connect the ends of the strings with a string connector 608.

In embodiments of the present invention, the designer can create island 605 or median 609 as a template and save that template for later use. In one embodiment of the present invention, a template is a model of an object which is inserted into the road model. By creating a template, the user can capture the relationships of the strings used to create island 605 or median 609 for reuse at a later time. When a template is inserted into a road model or another model, the user provides input on the strings that the template is dependant upon. Once inserted into a road model, the template loses its relationship to the original template and becomes an object within the road model. It is noted that embodiments of the present invention are not limited to creating templates of islands and medians alone and can be used to create templates for right turns, left turns, islands, turn lanes, or other objects. The designer can then insert the template of island 605 into the road model. In some embodiments of the present invention, the strings and string connectors comprising the template of island 605 are automatically integrated into the united layer 550 such that the bottom edge of island 605 corresponds with the surface layer (e.g., defined by the elevation of strings 510b and 520a) of united layer 550. Again, this is done in a manner which is largely automated from the perspective of the designer of the road model.

In another embodiment, a user can define which strings are to be connected. In another embodiment, median 609 is again created as a template which is inserted into the road model. In embodiments of the present invention, the inserted template can be re-sized and/or reconfigured by a designer without affecting the originally created template.

Figure 7:
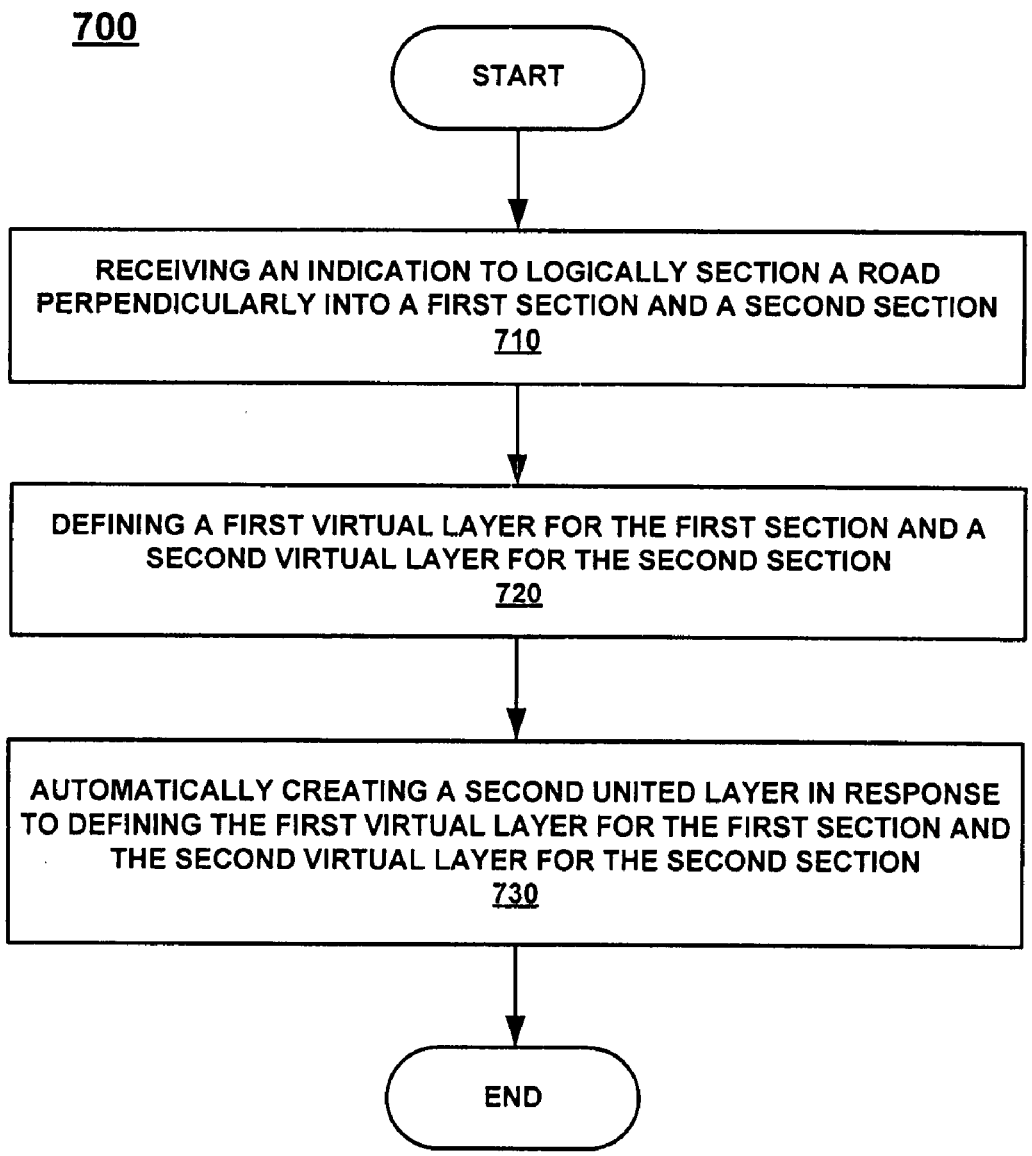
FIG. 7 is a flowchart of a method for excluding an intersection from a road model in accordance with embodiments of the present invention.
Figure 8:
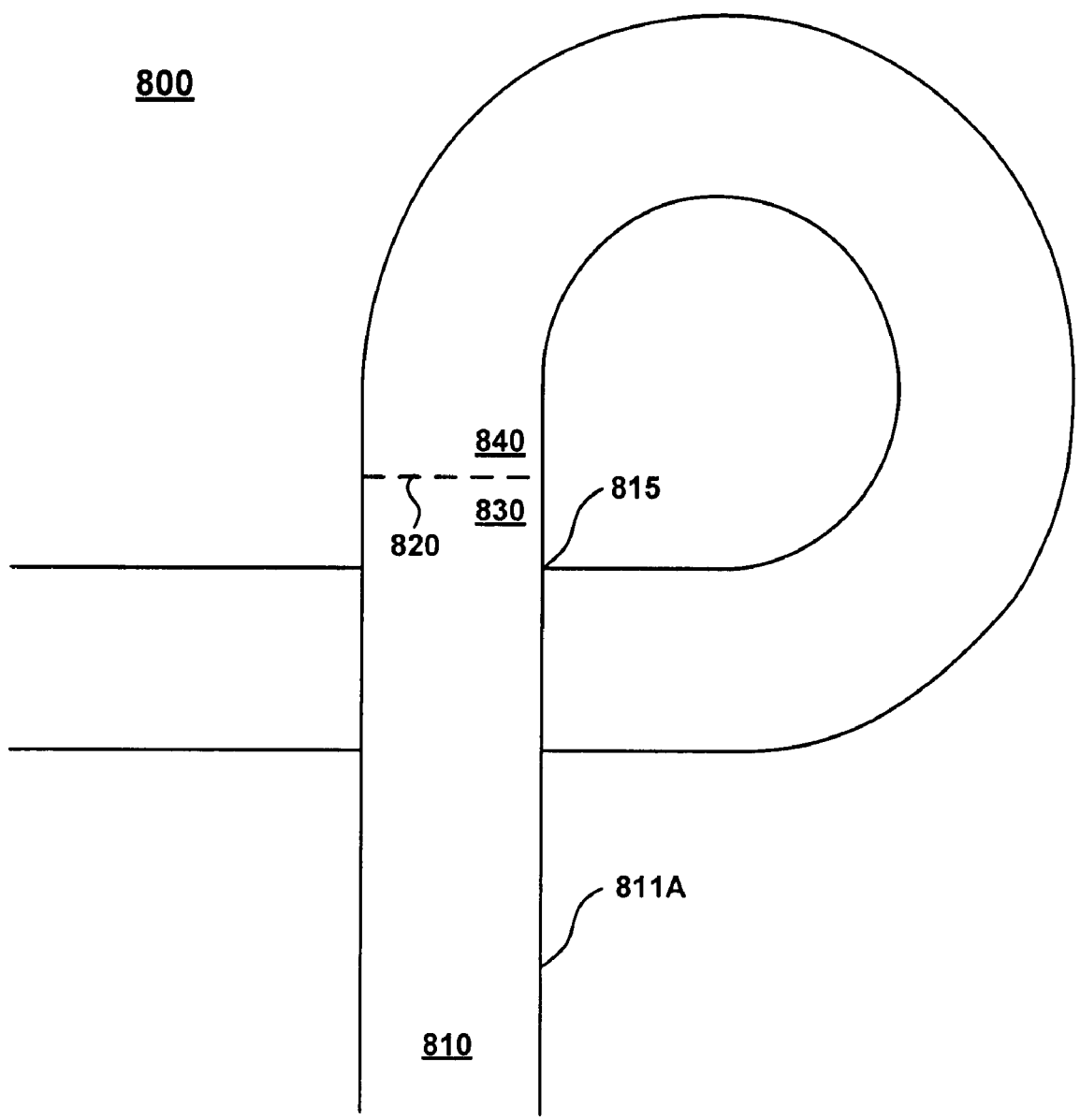
FIG. 8 is an overhead view of a highway interchange model created in accordance with embodiments of the present invention.

FIG. 7 is a flowchart of a method for creating a road model in accordance with embodiments of the present invention. In step 710 of FIG. 7, an indication to logically partition a road into a first section and a second section perpendicular to the road's alignment is received. In embodiments of the present invention, some road geometries are encountered which are not typically addressed by conventional road modeling systems. This is because many conventional road modeling systems model each road at an intersection as a separate entity. As an example, FIG. 8 shows an interchange model 800 created in accordance with embodiments of the present invention. In FIG. 8, road 810 loops and undergoes a level change such that one level passes beneath another. This may represent an on/off ramp for a highway for example. A road geometry such as this is problematic in that the highway string (e.g., 811a) is correctly represented as having two separate elevations at the same geographic position (e.g., 815 of FIG. 8).

In step 720 of FIG. 7, a first virtual layer which defines the first section and a second virtual layer which defines the second section are determined. In embodiments of the present invention, the layer comprises a first virtual layer and a second virtual layer. In embodiments of the present invention, each layer (e.g., a top layer and any sublayers) of a road in the model holds the definitions of the strings as defined by the user. This is where the user goes to retrieve and edit the strings. In one embodiment, by default, each layer owns one virtual layer. The virtual layer is a representation of a section of a layer (by default the whole layer). The user can optionally have several virtual layers for the same layer.

In one embodiment, each virtual layer is attached to one and only one united layer (equivalent to the resulting surface), however a united layer can be attached to more than one virtual layer. In FIG. 8, prior to being sectioned, road 810 has one top layer, one corresponding virtual layer and one united layer.

Referring again to FIG. 8, road 810 is logically partitioned by line 820 (e.g., step 710) into a first section 830 and a second section 840 (e.g., the portion of road 810 past line 820). In so doing, embodiments of the present invention logically create two virtual layers which facilitates having separate elevations at the same geographic other words, having two sections permits having two united layers which can meet as if they were different roads meeting at an intersection. Thus, the original virtual layer is split into 2 virtual layers at partition line 820 which was defined by the user at a given position along the centerline. The first virtual layer of first section 830 will refer to the original layer from its beginning to the partition line 820 and is attached to a first united layer. The second virtual layer of second section 840 will refer to the original virtual layer from the partition line 820 to the end and is attached to a second united layer. However, from the user standpoint, the model only has one layer with one partition line in embodiments of the present invention.

In step 730 of FIG. 7, a second united layer is automatically created in response to splitting the original virtual layer into two virtual layers that abut one another in step 720 above. In embodiments of the present invention, two new united layers are created to replace the original united layer to reflect the two sections created above in step 710. Both virtual layers then refer to the same strings; at different locations (refer to different parts of strings that do not cross themselves). That way, each new virtual layer is attached to a new united layer. Since the partial strings they ultimately are made of do not cross anymore (through the virtual layers), no Intersection Vertical Point will be created and the intersection will be excluded. Each united layer is going to build its own surface, and because they are formed by the same strings, both surfaces will match on their common edge (partition line 820).

If road 810 were not logically partitioned, the united layer would interpret the underpass as an intersection composed of self-intersecting strings. In embodiments of the present invention, the united layer would create the corresponding Intersection Vertical Points and insert the corresponding Calculated Vertical Points in the strings. As a result, a "net" of strings that cross at the same elevations is created, which allows the united layer to build a smooth surface for the intersection.

In embodiments of the present invention, the user has the option of discarding the intersection in order to avoid a merging of the united layers into a single surface. Thus, after having excluded the intersection, the model is made of one layer, one partition line 820, two virtual layers (referring to the layer before/after partition line 820), two corresponding united layers, no Intersection Vertical Point, and no Calculated Vertical Point. As discussed above, embodiments of the present invention would typically still treat two united layers which meet in this manner as an intersection. However, since the intersection was discarded, the two separate sections can now be modeled with the correct elevation changes such that second section 840 crosses under first section 830 without any apparent conflict regarding the separate elevations for intersecting strings at a given two-dimensional point.

Figure 9A:
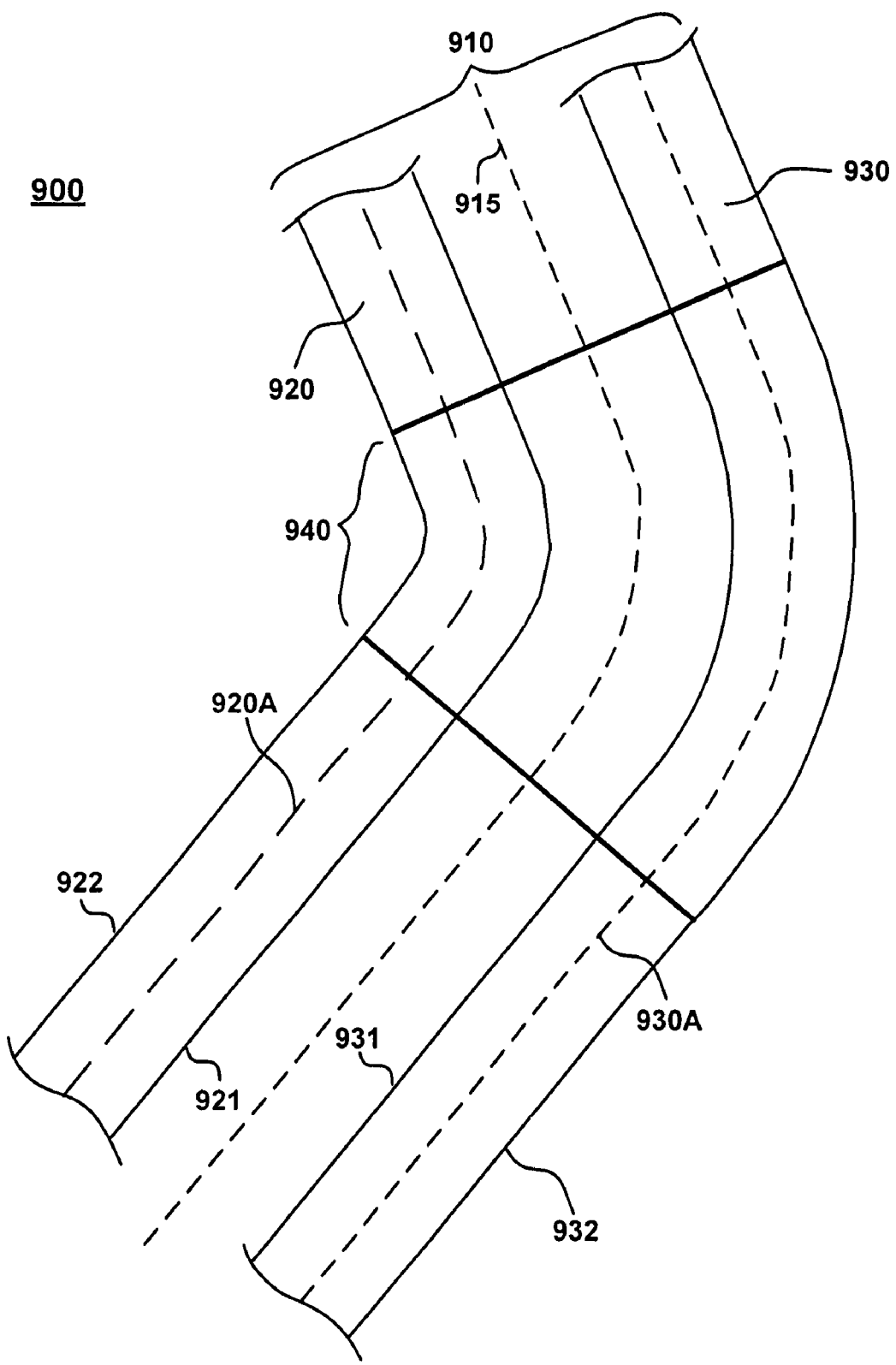
FIG. 9A is an overhead view of a road model created in accordance with embodiments of the present invention.

FIG. 9A is an overhead view of a road model 900 created in accordance with embodiments of the present invention. In the embodiment of FIG. 9, road 910 comprises a divided road. In other words, road 910 has been partitioned parallel to its alignment 915 into two separate roadways, roadway 920 and 930. The edges of roadway 920 are identified by strings 921 and 922. Similarly, the edges of roadway 930 are defined by strings 931 and 932. As discussed above, it is noted that the edges of additional sublayers may be defined by additional strings (not shown). Additionally, roadway 920 has a first axis 920A and roadway 930 has a second axis 930A. Having a divided highway is typically not a problem by itself. However, it can become problematic when each side needs to be superelevated around different axes (e.g., axes 920A and 930A).

Superelevation of a road is useful when the road curves because it permits maintaining a more constant rate of speed around the turn. Superelevation occurs when a cross section of the road is progressively banked around a longitudinal axis of the road until full superelevation is attained. An example of a superelevated road is the banking of a race track to permit the cars to turn at higher speeds.

The parameters defining a superelevation are described in a superelevation diagram. The engineers designing a road are responsible for providing a superelevation diagram for construction. The superelevation diagram describes the cross slope of the edges of pavement in the section of a road, from the beginning of the transition to full superelevation and back to normal. The rotation of the typical cross section can follow its own rule to go from no superelevation to full superelevation. The axis of rotation is typically about the centerline of construction, but it may be about the inside or outside edge of pavement.

Figure 9B:
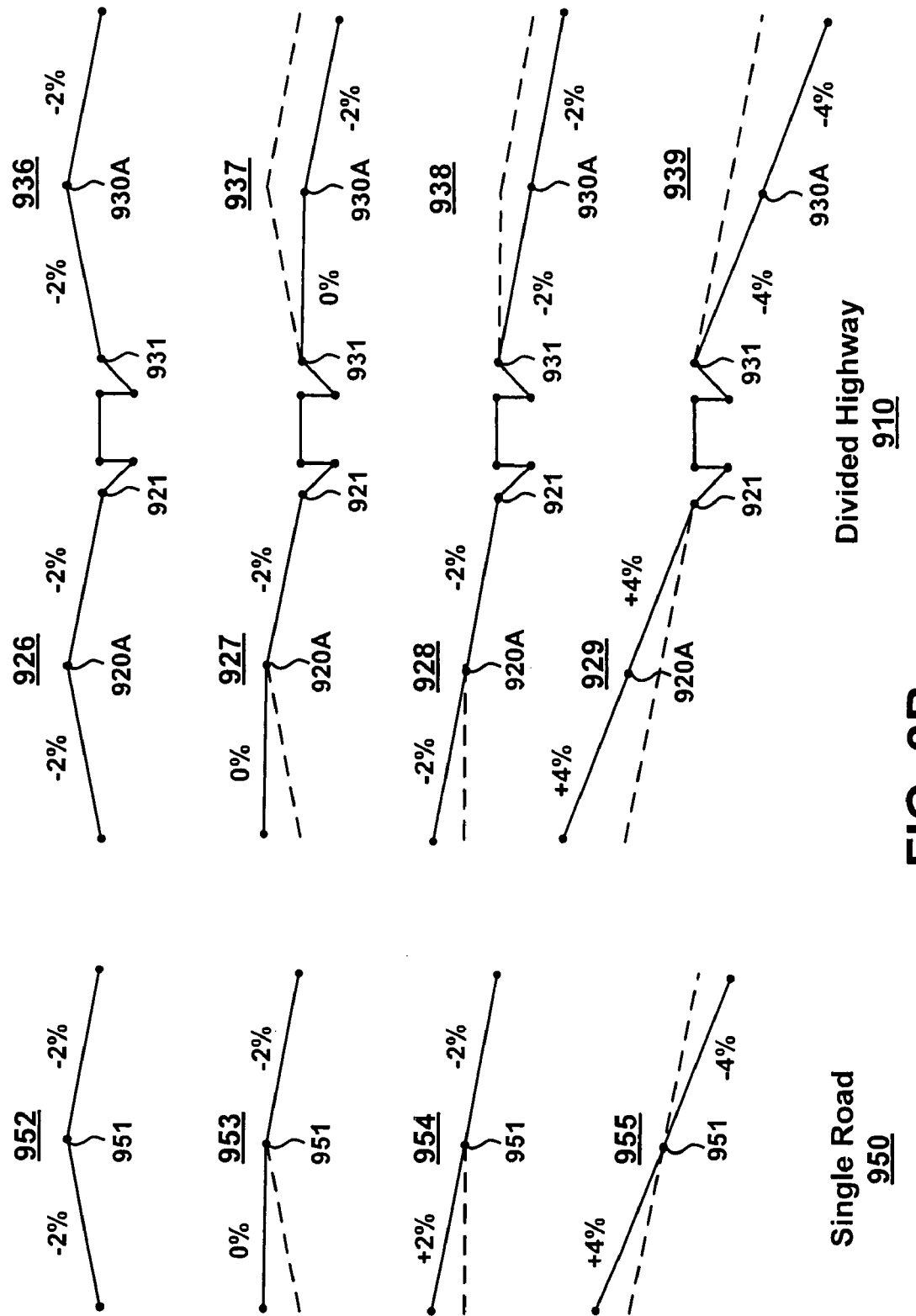
FIG. 9B shows cross sections of a superelevated roadway in accordance with embodiments of the present invention.

FIG. 9B shows cross sections of a superelevated roadway in accordance with embodiments of the present invention. In embodiments of the present invention, superelevations are defined by regions, with a beginning and an end along the road. As shown in FIG. 9A, road 910 comprises a superelevation region 940. A road may have zero, one or many of these regions. Within a superelevation region, the variation of slopes is defined for the road itself (it is not defined for each layer). In embodiments of the present invention, a road model utilizes a "superelevation region" to hold this concept. In embodiments of the present invention, a road model can have any number of superelevation regions. In embodiments of the present invention, a superelevation region basically represents the classic notion of superelevation diagram within a road model. Thus, embodiments of the present invention provide a tool for entering the characteristics of the superelevation diagram into the superelevation region of a road model.

Another characteristic of superelevations is the axis around which the slopes revolve. A single road typically has one axis of rotation and a divided highway may have one or more axes of rotation. As shown in FIG. 9B, a single road (e.g., 950) has a single axis of rotation (e.g., 951) around which the road is progressively rotated (e.g., 952, 953, and 954) until full superelevation is achieved (e.g., 955). Referring again to FIG. 9B, a divided highway (e.g., 910) has two axes of rotation. Roadway 920 is progressively rotated (e.g., 926, 927, and 928) around the string (e.g., 921) which defines the inside edge of the road along the media until full superelevation is achieved (e.g., 929). Roadway 930 is progressively rotated (e.g., 936, 937, and 938) around the string (e.g., 931) which defines the inside edge of the road along the media in the other direction until full superelevation (e.g., 939) is achieved. In one embodiment of the present invention, the definition of the axis is not part of the superelevation region. Instead, a roadway object in the road model holds this definition. In embodiments of the present invention, a roadway is basically a set of strings to which the superelevation is applied with one of the strings used as pivot. In embodiments of the present invention, a superelevation region is attached to at least one roadway and is in charge of applying the corresponding sets of strings around the right axis according to its superelevation diagram.

Thus, embodiments of the present invention facilitate creating superelevation diagrams because it is easier to create the superelevation diagram as two roadways with separate axes of rotation. In conventional road modeling systems, the divided roadway is still treated as a single roadway. Thus, to model superelevation of a divided road, a single road with multiple axes of rotation is necessitated, thus greatly complicating the design process.

FIG. 11 is a flowchart of an exemplary method for creating a road model in accordance with embodiments of the present invention. In step 1110 of FIG. 11, a first roadway of a divided road is identified using a first plurality of strings. As shown in FIG. 9A, road 910 comprises a first roadway 920.

In step 1120 of FIG. 11, a superelevation region is assigned to the first roadway. As shown in FIG. 9A, roadway 920 comprises a superelevation region 925. It is noted that embodiments of the present invention, may assign superelevation regions to one or more roadways. For example, when roadway 920 and 930 are substantially parallel within a curve, each roadway can have a respective superelevation region assigned to it. In one embodiment, each sublayer of, for example, roadway 920 may be separately assigned a superelevation region.

In step 1130 of FIG. 11, an axis of rotation is implemented within the superelevation region of the first roadway. As shown in FIG. 9B, separate axes of rotation are assigned to each roadway within the superelevation region. Thus, roadway 920 exhibits a separate axis of rotation than roadway 930. There may also be instances when it is desired to apply different superelevations to the roadways on the same section of road. Thus, embodiments of the present invention may assign a different superelevation region to each roadway.

Figure 10:
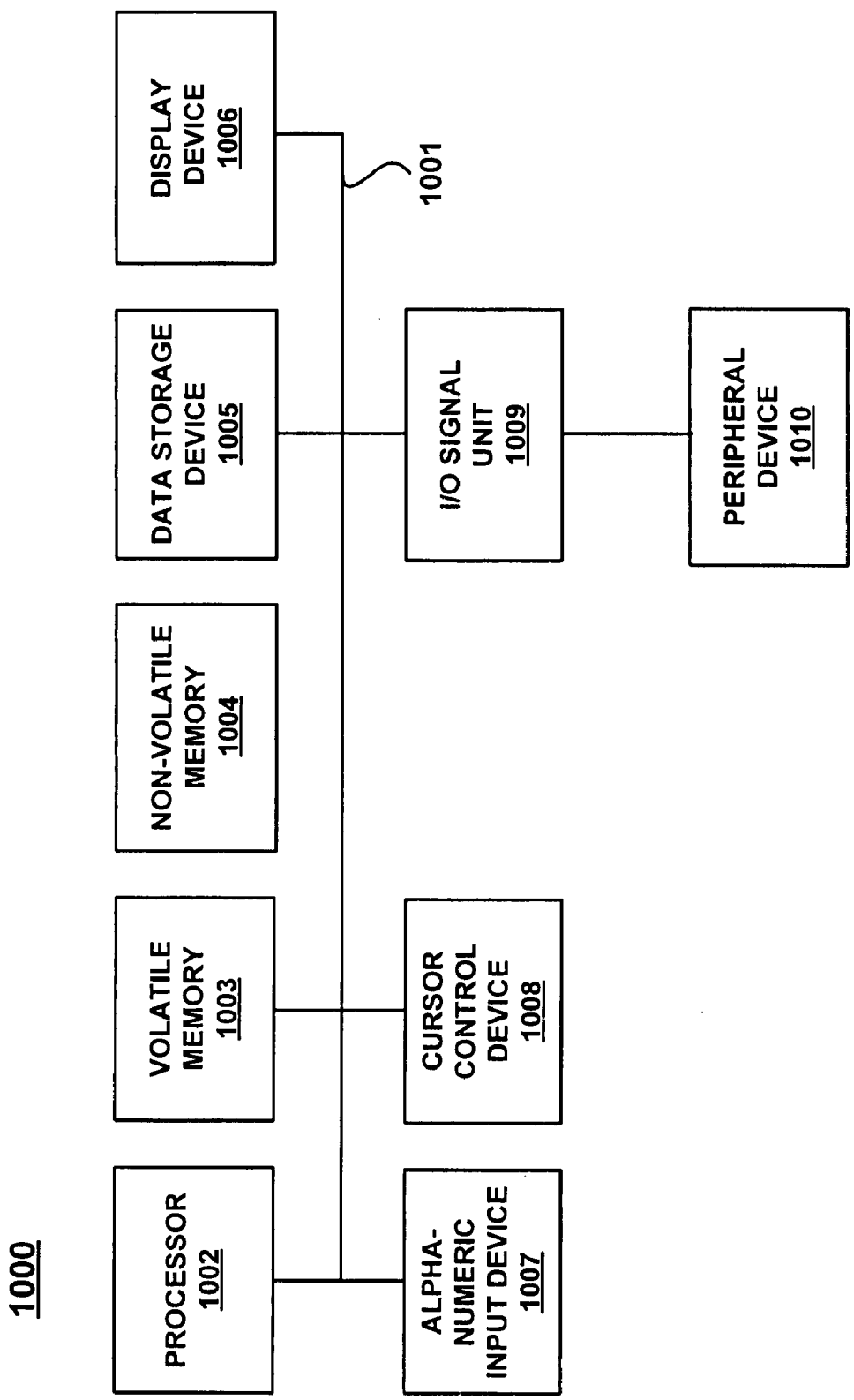
FIG. 10 is a block diagram of an exemplary computer system upon which embodiments of the present invention may be implemented.

With reference to FIG. 10, portions of the present invention are comprised of computer-readable and computer-executable instructions that reside, for example, in computer system 1000 which is used as a part of a general purpose computer network (not shown). It is appreciated that computer system 1000 of FIG. 10 is exemplary only and that the present invention can operate within a number of different computer systems including general-purpose computer systems, embedded computer systems, laptop computer systems, hand-held computer systems, and stand-alone computer systems.

In the present embodiment, computer system 1000 includes an address/data bus 1001 for conveying digital information between the various components, a central processor unit (CPU) 1002 for processing the digital information and instructions, a volatile main memory 1003 comprised of volatile random access memory (RAM) for storing the digital information and instructions, and a non-volatile read only memory (ROM) 1004 for storing information and instructions of a more permanent nature. In addition, computer system 1000 may also include a data storage device 1005 (e.g., a magnetic, optical, floppy, or tape drive or the like) for storing vast amounts of data. In one embodiment, data storage device 1005 comprises a removable data storage device. It should be noted that the software program for creating a road model in accordance with embodiments of the present invention can be stored either in volatile memory 1003, data storage device 1005, in an external storage device (not shown), or accessed via a network connection.

Devices which are optionally coupled to computer system 1000 include a display device 1006 for displaying information to a computer user, an alpha-numeric input device 1007 (e.g., a keyboard), and a cursor control device 1008 (e.g., mouse, trackball, light pen, etc.) for inputting data, selections, updates, etc. Computer system 1000 can also include a mechanism for emitting an audible signal (not shown).

Returning still to FIG. 10, optional display device 1006 of FIG. 10 may be a liquid crystal device, cathode ray tube, or other display device suitable for creating graphic images and alpha-numeric characters recognizable to a user. Optional cursor control device 1008 allows the computer user to dynamically signal the two dimensional movement of a visible symbol (cursor) on a display screen of display device 1006. Many implementations of cursor control device 1008 are known in the art including a trackball, mouse, touch pad, joystick, or special keys on alpha-numeric input 1007 capable of signaling movement of a given direction or manner displacement. Alternatively, it will be appreciated that a cursor can be directed and/or activated via input from alpha-numeric input 1007 using special keys and key sequence commands. Alternatively, the cursor may be directed and/or activated via input from a number of specially adapted cursor directing devices.

Furthermore, computer system 1000 can include an input/output (I/O) signal unit (e.g., interface) 1009 for interfacing with a peripheral device 1010 (e.g., a computer network, modem, mass storage device, etc.). Accordingly, computer system 1000 may be coupled in a network, such as a client/server environment, whereby a number of clients (e.g., personal computers, workstations, portable computers, minicomputers, terminals, etc.) are used to run processes for performing desired tasks. In particular, computer system 1000 can be coupled in a system for creating a road model.

Embodiments of the present invention, creating a road model, are thus described. While the present invention has been described in particular embodiments, it should be appreciated that the present invention should not be construed as limited by such embodiments, but rather construed according to the below claims.

What is claimed is:

1. A computer implemented method for creating a road model, said method comprising:
receiving an identification of an intersection of a first road and a second road;

receiving at least one designated elevation at which strings defining said first road and said second road are designated to merge to form a continuous surface of said intersection; and automatically creating, by a computer system, a united layer for said intersection wherein a first plurality of strings defining said first road and a second plurality of strings defining said second road are defined in said road model to intersect at said at least one designated elevation such that said united layer of said road model is usable by machine control systems of road construction equipment to form said continuous surface, wherein said first road defines said at least one designated elevation.

2. The method as recited in claim 1 further comprising:

receiving an indication that an elevation of any of said first plurality of strings and said second plurality of strings has changed; and automatically changing, by said computer system, said at least one designated elevation in response to said indication.

3. The method as recited in claim 2 further comprising:

defining a second layer of said first road using a third plurality of strings;

defining a second layer of said second road using a fourth plurality of strings; and automatically defining, by said computer system, at least one second elevation at which said third plurality of strings intersects said fourth plurality of strings.

4. The method as recited in claim 3 further comprising:

automatically changing, by said computer system, said at least one second elevation in response to said automatically changing, by said computer system, said at least one designated elevation.

5. The method as recited in claim 1 further comprising:

determining at least one two-dimensional position at which one of said first plurality of strings intersects one of said second plurality of strings; and determining an elevation of said at least one two-dimensional position.

6. The method as recited in claim 5 further comprising:

determining a difference in the elevation of said one of said first plurality of strings at said two-dimensional position from the elevation of said string of one of said second plurality of strings at said two-dimensional position; and changing the elevation of said one of said second plurality of strings to match the elevation of said one of said first plurality of strings at said two-dimensional position.

7. The method as recited in claim 1 further comprising:

utilizing a string connector to transition from one of said first plurality of strings to one of said second plurality of strings at said intersection.

8. The method as recited in claim 1 further comprising:

identifying a template of a feature for use in said road model; and inserting said template into said road model wherein at least one string defining said feature corresponds with at least one string of said united layer.

9. A computer system comprising:

a bus;

a memory unit communicatively coupled with said bus; and a processor communicatively coupled with said bus, said processor for executing a method for creating a road model, said method comprising:

receiving an identification of an intersection of a first road and a second road;

receiving at least one designated elevation at which strings defining said first road and said second road are designated to merge to form a continuous surface of said intersection; and automatically creating, by said computer system, a united layer for said intersection wherein a first plurality of strings defining said first road and a second plurality of strings defining said second road are defined in said road model to intersect at said at least one designated elevation such that said united layer of said road model is usable by machine control systems of road construction equipment to form said continuous surface, wherein said first road defines said at least one designated elevation.

10. The computer system of claim 9 wherein said method further comprises:

receiving an indication that an elevation of any of said first plurality of strings and said second plurality of strings has changed; and automatically changing, by said computer system, said at least one designated elevation in response to said indication.

11. The computer system of claim 10 wherein said method further comprises:

defining a second layer of said first road using a third plurality of strings;

defining a second layer of said second road using a fourth plurality of strings; and automatically defining, by said computer system, at least one second elevation at which said third plurality of strings intersects said fourth plurality of strings.

12. The computer system of claim 11 wherein said method further comprises:

automatically changing, by said computer system, said at least one second elevation in response to said automatically changing, by said computer system, said at least one designated elevation.

13. The computer system of claim 9 wherein said method further comprises:

determining at least one two-dimensional position at which one of said first plurality of strings intersects one of said second plurality of strings; and determining an elevation of said at least one two-dimensional position.

14. The computer system of claim 13 wherein said method further comprises:

determining a difference in the elevation of said one of said first plurality of strings at said two-dimensional position from the elevation of said string of one of said second plurality of strings at said two-dimensional position; and changing the elevation of said one of said second plurality of strings to match the elevation of said one of said first plurality of strings at said two-dimensional position.

15. The computer system of claim 9 wherein said method further comprises:

utilizing a string connector to transition from one of said first plurality of strings to one of said second plurality of strings at said intersection.

16. The computer system of claim 9 wherein said method further comprises:

identifying a template of a feature for use in said road model; and inserting said template into said road model wherein at least one string defining said feature corresponds with at least one string of said united layer.

17. A non-transitory computer-usable storage medium having computer-readable program code embodied therein which, when executed, causes a computer system to perform a method for creating a road model; said method comprising:
  receiving an identification of an intersection of a first road and a second road;
  receiving at least one designated elevation at which strings defining said first road and said second road are designated to merge to form a continuous surface of said intersection; and
  automatically creating, by said computer system, a united layer for said intersection wherein a first plurality of strings defining said first road and a second plurality of strings defining said second road are defined in said road model to intersect at said at least one designated elevation such that said united layer of said road model is usable by machine control systems of road construction equipment to form said continuous surface, wherein said first road defines said at least one designated elevation.

18. The non-transitory computer-usable storage medium of claim 17 wherein said method further comprises:
  receiving an indication that an elevation of any of said first plurality of strings and said second plurality of strings has changed; and
  automatically changing, by said computer system, said at least one designated elevation in response to said indication.

19. The non-transitory computer-usable storage medium of claim 18 wherein said method further comprises:
  defining a second layer of said first road using a third plurality of strings;
  defining a second layer of said second road using a fourth plurality of strings; and
  automatically defining, by said computer system, at least one second elevation at which said third plurality of strings intersects said fourth plurality of strings.

20. The non-transitory computer-usable storage medium of claim 19 wherein said method further comprises:
  automatically changing, by said computer system, said at least one second elevation in response to said automatically changing, by said computer system, said at least one designated elevation.

21. The non-transitory computer-usable storage medium of claim 17 wherein said method further comprises:
  determining at least one two-dimensional position at which one of said first plurality of strings intersects one of said second plurality of strings; and
  determining an elevation of said at least one two-dimensional position.

22. The non-transitory computer-usable storage medium of claim 21 wherein said method further comprises:
  determining a difference in the elevation of said one of said first plurality of strings at said two-dimensional position from the elevation of said string of one of said second plurality of strings at said two-dimensional position; and
  changing the elevation of said one of said second plurality of strings to match the elevation of said one of said first plurality of strings at said two-dimensional position.

23. The non-transitory computer-usable storage medium of claim 17 wherein said method further comprises:
  utilizing a string connector to transition from one of said first plurality of strings to one of said second plurality of strings at said intersection.

24. The non-transitory computer-usable storage medium of claim 17 wherein said method further comprises:
  identifying a template of a feature for use in said road model; and
  inserting said template into said road model wherein at least one string defining said feature corresponds with at least one string of said united layer.

* * * * *